United States Patent
Abel et al.

(10) Patent No.: US 10,714,242 B2
(45) Date of Patent: Jul. 14, 2020

(54) SYMMETRICALLY TUNABLE ELECTRICAL RESISTOR

(71) Applicant: INTERNATIONAL BUSINESS MACHINES CORPORATION, Armonk, NY (US)

(72) Inventors: Stefan Abel, Zürich (CH); Jean Fompeyrine, Waedenswil (CH); Johannes Gooth, Horgen (CH); Bernd Gotsmann, Horgen (CH); Fabian Menges, Urdorf (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/848,085

(22) Filed: Dec. 20, 2017

(65) Prior Publication Data
US 2019/0189311 A1    Jun. 20, 2019

(51) Int. Cl.
*H01C 10/16*    (2006.01)
*H01L 27/08*    (2006.01)
(Continued)

(52) U.S. Cl.
CPC .............. *H01C 10/16* (2013.01); *G11C 11/22* (2013.01); *H01C 7/006* (2013.01); *H01C 10/14* (2013.01);
(Continued)

(58) Field of Classification Search
CPC ...... H01C 10/16; H01C 17/267; H01C 10/14; H01C 7/006; G11C 11/22; H01L 28/20; H01L 27/0802; H01L 22/34
See application file for complete search history.

(56) References Cited

U.S. PATENT DOCUMENTS

| 8,659,340 B2 | 2/2014 | Shiue |
| 9,231,209 B2 | 1/2016 | Mares |

(Continued)

OTHER PUBLICATIONS

Boyn et al., "High-performance ferroelectric memory based on fully patterned tunnel junctions", Applied Physics Letters, vol. 104, pp. 052909-1-052909-3 (2014).
(Continued)

*Primary Examiner* — Selim U Ahmed
(74) *Attorney, Agent, or Firm* — Michael A. Petrocelli

(57) ABSTRACT

An electrical resistor element, system, and method related thereto, wherein the electrical resistor element includes a tunable resistance. The electrical resistor element comprises a first contact electrode, a second contact electrode and a ferroelectric layer arranged between the first contact electrode and the second contact electrode. The ferroelectric layer comprises a first area having a first polarization direction and a second area having a second polarization direction. The first polarization direction is different to the second polarization direction. The ferroelectric layer further comprises a domain wall between the first area and the second area. The electrical resistor element further comprises a first pinning element configured to stabilize the first polarization direction of the ferroelectric layer. The electrical resistor element further comprises a control circuit configured to tune the resistance of the electrical resistor element by applying electrical pulses to the ferroelectric layer such that the ferroelectric domain wall is moved.

34 Claims, 6 Drawing Sheets

(51) Int. Cl.

| H01C 7/00 | (2006.01) |
| H01C 10/14 | (2006.01) |
| H01L 49/02 | (2006.01) |
| G11C 11/22 | (2006.01) |
| H01C 17/26 | (2006.01) |
| H01L 21/66 | (2006.01) |

(52) U.S. Cl.
CPC .......... *H01C 17/267* (2013.01); *H01L 28/20* (2013.01); *H01L 22/34* (2013.01); *H01L 27/0802* (2013.01)

(56) References Cited

U.S. PATENT DOCUMENTS

| 9,679,686 | B2 | 6/2017 | Zickel | |
| 2004/0085797 | A1* | 5/2004 | Mei | G11C 16/02 365/96 |
| 2009/0155931 | A1* | 6/2009 | Ma | C30B 23/02 438/3 |
| 2010/0135059 | A1* | 6/2010 | Pi | G11C 19/0841 365/80 |
| 2010/0187583 | A1* | 7/2010 | Wrazien | B82Y 10/00 257/295 |
| 2010/0208381 | A1* | 8/2010 | Kim | G11O 5/04 360/69 |
| 2013/0311415 | A1 | 11/2013 | Nishitani et al. | |
| 2014/0169061 | A1 | 6/2014 | Bibes et al. | |
| 2015/0269984 | A1* | 9/2015 | Elmegreen | G11C 11/22 365/145 |
| 2016/0064660 | A1 | 3/2016 | Ignatiev et al. | |

OTHER PUBLICATIONS

Burr et al., "Large-scale neural networks implemented with non-volatile memory as the synaptic weight element: comparative performance analysis (accuracy, speed, and power)", 2015 IEEE, IEDM15-76, pp. 4.4.1-4.4.4.

Burr et al., "Recent Progress in Phase-Change Memory Technology", IEEE Journal on Emerging and Selected Topics in Circuits and Systems, vol. 6, No. 2, Jun. 2016, pp. 146-162.

Chanthbouala et al., "A ferroelectric memristor", Nature Materials | Letter, vol. 11, pp. 860-864, Published online Sep. 16, 2012.

Crassous et al., "Polarization charge as a reconfigurable quasi-dopant in ferroelectric thin films", Nature Nanotechnology | Letter, vol. 10, pp. 614-618, Published online Jun. 15, 2015.

Garbin et al., "HfO2-Based OxRAM Devices as Synapses for Convolutional Neural Networks", IEEE Transactions on Electron Devices, vol. 62, No. 8, Aug. 2015, pp. 2494-2501.

Gokmen et al., "Acceleration of Deep Neural Network Training with Resistive Cross-Point Devices", Design Considerations, Front. Neurosci., vol. 10, pp. 1-19, (2016).

Jo et al., Abstract for "Nanoscale Memristor Device as Synapse in Neuromorphic Systems", Nano Letters, Mar. 1, 2010, vol. 10, No. 4, pp. 1297-1301.

McGilly et al., "Controlling domain wall motion in ferroelectric thin films", Nature Nanotechnology | Letter, vol. 10, pp. 145-150, Published online Jan. 26, 2015.

Chanthbouala et al., "Solid-state memories based on ferroelectric tunnel junctions", Nature Nanotechnology | Letter, vol. 7, pp. 101-104, Published online Dec. 4, 2011.

Tuma et al., "Stochastic phase-change neurons", Article Preview, Nature Nanotechnology | Letter, vol. 11, pp. 693-699, Published online May 16, 2016.

Wang et al., "3D Synaptic Architecture with Ultralow sub-10 fJ Energy per Spike for Neuromorphic Computation", 2014 IEEE, IEDM14-665, pp. 28.5.1-28.5.4.

Yang et al., Abstract for "Memristive devices for computing", Nature Nanotechnology | Review, vol. 8, pp. 13-24, Published online Dec. 27, 2012.

* cited by examiner

SYMMETRICALLY TUNABLE ELECTRICAL RESISTOR

BACKGROUND

Neuromorphic networks are widely used in pattern recognition and classification, with many potential applications from fingerprint, iris, and face recognition to target acquisition, etc. The parameters (e.g., 'synaptic weights') of the neuromorphic networks are adaptively trained on a set of patterns during a learning process, following which the neuromorphic network is able to recognize or classify patterns of the same kind.

A key component of a neuromorphic network is the 'synapse,' at which weight information is stored, typically as a continuous-valued variable. For applications that would benefit from compact, high-performance, low-power, portable neuromorphic network computation, it is desirable to be able to construct high-density hardware neuromorphic networks having a large number of synapses ($10^9$-$10^{10}$ or more). Currently a neuromorphic network is typically realized as a software algorithm implemented on a general-purpose computer, although hardware for neuromorphic networks exist.

Phase change based resistors for mimicking the function of synapses are known e.g. from the paper by Tuma et al., Nature Nanotechnology 11, 693-699, 2016.

However, the resistance of such phase changed based resistors cannot be changed symmetrically upon the polarity of an input signal.

SUMMARY

Hence, there is a need for continuously and symmetrically tunable resistors. Such devices may also be beneficial for many other applications than neuromorphic computing.

According to a first aspect, the invention is embodied as an electrical resistor element with tunable resistance. The electrical resistor element comprises a first contact electrode, a second contact electrode and a ferroelectric layer arranged between the first contact electrode and the second contact electrode. The ferroelectric layer comprises a first area having a first polarization direction and a second area having a second polarization direction. The first polarization direction is different to the second polarization direction. The ferroelectric layer further comprises a domain wall between the first area and the second area. The electrical resistor element further comprises a first pinning element configured to stabilize the first polarization direction of the ferroelectric layer. The electrical resistor element further comprises a control circuit configured to tune the resistance of the electrical resistor element by applying electrical pulses to the ferroelectric layer such that the ferroelectric domain wall is moved.

The resistance of such an embodied electrical resistor element may be symmetrically and continuously tuned by the application of electrical pulses. Hence, embodiments of the invention provide a kind of solid-state potentiometer. According to embodiments, symmetrical tuning shall mean that an incremental increase or decrease of the resistance is identical at each resistance state for both polarities of the electrical pulses.

The tuning by means of the electrical pulses is field-driven. This may provide advantages in terms of robustness and/or or power efficiency compared with heat driven solutions. Furthermore, electrical resistor elements according to embodiments of the invention are scalable and CMOS compatible, thereby allowing high integration densities.

According to an embodiment the electrical resistor further comprises a second pinning element configured to stabilize the second polarization direction of the ferroelectric layer.

According to an embodiment, the control unit is configured to increase the resistance of the resistor element by applying electrical pulses of a first polarity and to decrease the resistance of the resistor element by applying electrical pulses of a second polarity. The second polarity is opposite to the first polarity.

Hence, the direction of the resistance tuning can be amended by changing the polarity of the electrical pulses. This is a very efficient and elegant solution.

According to embodiments, the tunable resistance of the electrical resistor element is defined by the position of the domain wall. According to embodiments, the control circuit is configured to control the position of the domain wall by the pulse length of the electrical pulses. The longer the pulse length, the more the position of the domain wall is shifted and the greater the corresponding resistance change.

According to a preferred embodiment, the electrical resistor element comprises only a single domain wall. However, according to other embodiments, also two or more domain walls may be used.

According to an embodiment, the ferroelectric layer is embodied as ferroelectric thin film having a thickness of less than 10 nm. Such an embodied resistor element may allow to use tunnel currents and tunnel resistances for the tuning of the resistance. More particularly, according to an embodiment, the first area has a first tunnel resistance and the second area has a second tunnel resistance. Furthermore, the resistor element is configured to tune the resistance by the volume ratio of the first area having the first tunnel resistance and the second area having the second tunnel resistance. This allows an efficient tuning with low power consumption.

According to an embodiment, the domain wall is a conductive domain wall. Such a conductive domain wall may then serve as an electrical bridge between the first contact electrode and the second contact electrode. More particularly, according to an embodiment, the first contact electrode and the second contact electrode are embodied as resistive electrodes. Furthermore, the resistor element is configured to tune the resistance by a length of a current path within the first and the second contact electrode. According to such an embodiment, the position of the domain wall determines the length of the current path between the domain wall and contact points of the first and the second contact electrode. The longer the current path within the contact electrodes, the higher the resistance.

According to an embodiment, the ferroelectric domain wall has side portions and a front portion and the resistor element is configured to tune the resistance by the length of the side portions of the ferroelectric domain wall.

According to such an embodiment, the resistance of the domain wall is also dependent on the position of the domain wall. In other words, the resistance between the first contact electrode and the second contact electrode is determined by the total length of the domain wall(s).

According to an embodiment, the resistive memory element comprises a piezoresistive layer adjacent to the ferroelectric layer. Furthermore, the ferroelectric domain wall is configured to apply strain on the piezoresistive layer, thereby changing the electrical resistance of the piezoelectric layer and of the electrical resistor element. According to such an embodiment, the domain wall as such may be non-conductive, but the domain wall applies stress on the piezoresistive layer which changes the resistance of the piezoresistive layer at the position of the domain wall.

According to an embodiment, the first pinning element comprises a first set of static pinning electrodes configured to polarize a first ferroelectric pinning layer in the first polarization direction and the second pinning element comprises a second set of static pinning electrodes configured to polarize a second ferroelectric pinning layer in the second polarization direction. This is a reliable and efficient solution to stabilize or pin the polarizations of the ferroelectric layer. The first and the second ferroelectric pinning layers establish pre-polarized ferroelectric pinning elements with a higher coercive field than the electrical pulses applied for resistance tuning. The first ferroelectric pinning layer and the second ferroelectric pinning layer may comprise different ferroelectric materials than the ferroelectric layer (tuning layer). In particular, the coercive field of the pinning layers may be larger than the coercive field of the ferroelectric layer (tuning layer).

According to an embodiment, the first pinning element comprises a first polarized interface configured to pole a first ferroelectric pinning layer in the first polarization direction and the second pinning element comprises a second polarized interface configured to pole a second ferroelectric pinning layer in the second polarization direction. According to such an embodiment, polarized interfaces, e.g. between the ferroelectric layer and the first and the second ferroelectric pinning layer, may be used for the pinning. The polarized interfaces may be implemented e.g. by dipoles. Such an embodiment avoids external pinning electrodes.

According to another embodiment, the first pinning element comprises a first coupling electrode and the second pinning element comprises a second coupling electrode. The electrical resistor element is configured to apply the electrical pulses of the first polarity in parallel to the first pinning element and to the first contact electrode. Furthermore, the electrical resistor element is configured to apply the electrical pulses of the second polarity in parallel to the second pinning element and to first contact electrode. In addition, a coupling resistance of the first coupling electrode and of the second coupling electrode is lower than a coupling resistance of the first contact electrode.

With such an embodiment, the electrical pulses provide in parallel two functions. On the one hand, they change the electrical resistance and concurrently they stabilize/pin the first or the second polarization direction. The lower coupling resistance of the first and the second coupling electrode results in an increased electrical field of the electrical pulses in the area of the first or the second coupling electrode, which in return stabilizes the corresponding polarization. A splitting of the electrical pulses of the first polarity and the electrical pulses of the second polarity may be implemented e.g. by a set of diodes.

The ferroelectric layer may comprise in particular BaTiO3, BiFeO3, PbTiO3, PbZr/TiO3, LiNbO3, Pb[Zr$_x$ Ti$_{1-x}$]O$_3$ or ferroelectric polymers.

Embodiments of the resistor element may be in particular used in neuromorphic computing systems or neuromorphic networks. Here the plurality of electrical resistor elements may be used in particular as synapses to allow a symmetric change of the resistance in both directions.

Another aspect of the invention relates to a method for tuning the resistance of an electrical resistor element. The electrical resistor element comprises a first contact electrode, a second contact electrode and a ferroelectric layer arranged between the first contact electrode and the second contact electrode. The ferroelectric layer comprises a first area having a first polarization direction, a second area having a second, different polarization direction and a domain wall between the first area and the second area. The method comprises steps of stabilizing, by a first pinning element, the first polarization direction of the ferroelectric layer. A further step comprises tuning, by a control circuit, the resistance of the electrical resistor element by applying electrical pulses to the ferroelectric layer, thereby moving the ferroelectric domain wall.

According to an embodiment the method comprises a further step of stabilizing, by a second pinning element, the second polarization direction of the ferroelectric layer.

Another aspect of the invention relates to a design structure tangibly embodied in a machine readable medium for designing, manufacturing, or testing an integrated circuit. The design structure comprises an electrical resistor element according to the first aspect.

In another aspect according to the invention, a neuromorphic computing system, comprises: a plurality of electrical resistor elements as synapses. Each of the plurality of electrical resistor elements have tunable resistance, and each of the plurality of electrical resister elements include: a first contact electrode; a second contact electrode; a ferroelectric layer arranged between the first contact electrode and the second contact electrode, the ferroelectric layer comprising: a first area having a first polarization direction; a second area having a second polarization direction, the first polarization direction being different to the second polarization direction; and a domain wall is between the first area and the second area. A first pinning element is configured to stabilize the first polarization direction of the ferroelectric layer; and a control circuit is configured to tune the resistance of the electrical resistor element by applying electrical pulses to the ferroelectric layer such that the ferroelectric domain wall is moved.

In another aspect according to the invention, a method for tuning the resistance of an electrical resistor element, comprises: stabilizing, by a first pinning element, a first polarization direction of a ferroelectric layer of an electrical resistor element; and tuning, by a control circuit, a resistance of the electrical resistor element by applying electrical pulses to the ferroelectric layer, thereby moving a ferroelectric domain wall. The electrical resistor element, including: a first contact electrode; a second contact electrode; the ferroelectric layer arranged between the first contact electrode and the second contact electrode, the ferroelectric layer including; a first area having the first polarization direction; a second area having a second polarization direction, the first polarization direction being different to the second polarization direction; and the domain wall is between the first area and the second area.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. The drawing are discussed forthwith below.

DETAILED DESCRIPTION

Figure 1A:
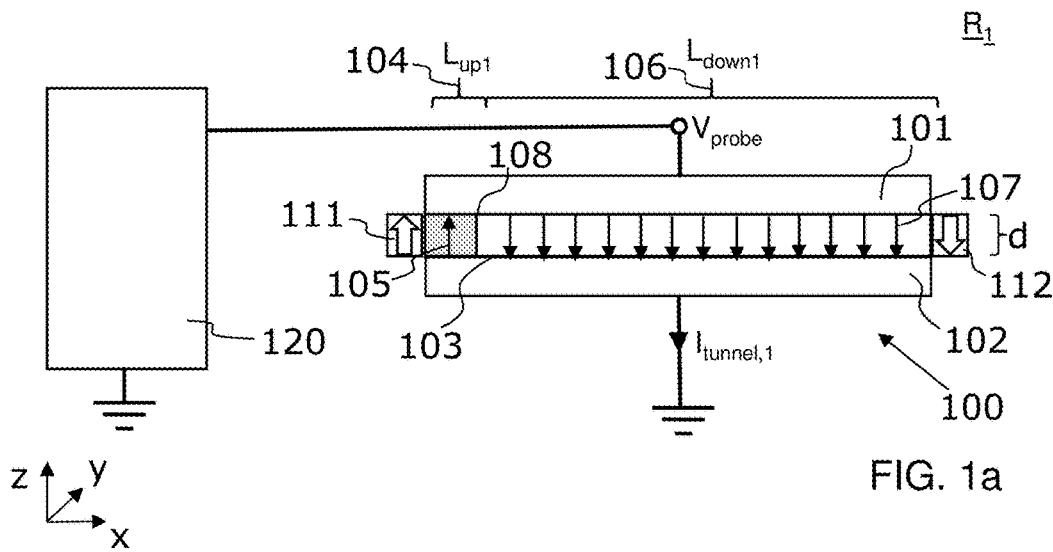
FIGS. 1a, 1b and 1c illustrate an electrical resistor element according to an embodiment of the invention in different resistance states.
Figure 1B:
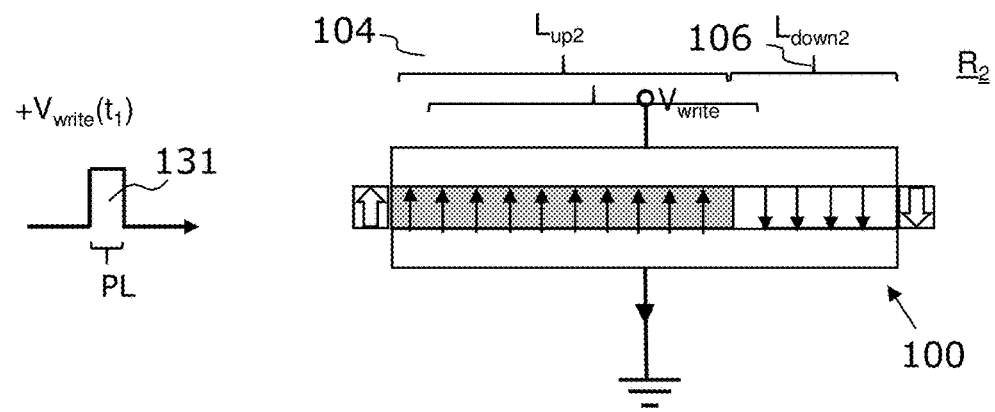
Figure 1C:
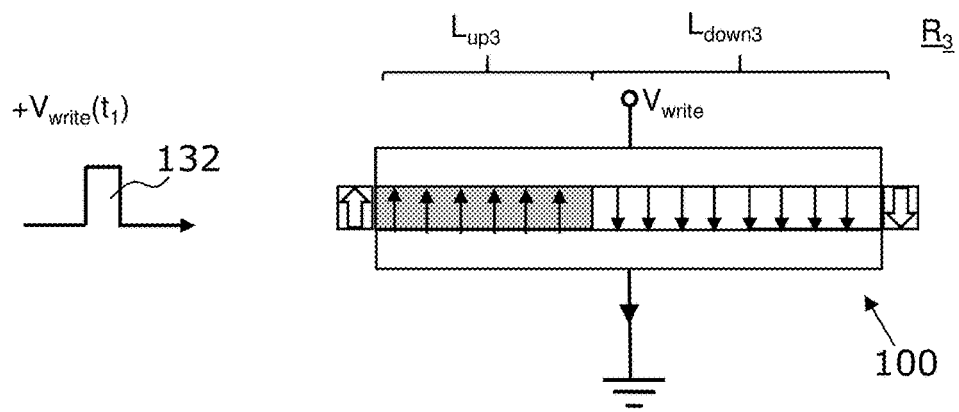

FIGS. 1a, 1b and 1c illustrate an electrical resistor element according to an embodiment of the invention in different resistance states.

Referring to FIG. 1a, an electrical resistor element 100 is shown having a first contact electrode 101, a second contact electrode 102 and a ferroelectric layer 103 arranged between the first contact electrode 101 and the second contact electrode 102.

The ferroelectric layer 103 comprises a first area 104 having a first polarization direction 105 and a second area 106 having a second polarization direction 107. The first polarization direction 105 is different to the second polarization direction 107 and in this example opposite to the second polarization direction 107. According to other embodiments, the first polarization direction 105 could be pointing in a +45° direction and the second polarization direction in a +135° direction (when looking at the cross sections).

The first area 104 and the second area 106 are separated by a domain wall 108.

The electrical resistor element 100 further comprises a first pinning element 111 configured to stabilize the first polarization direction 105 of the ferroelectric layer 103 and a second pinning element 112 configured to stabilize the second polarization direction 107 of the ferroelectric layer 103.

Furthermore, a control circuit 120 is configured to tune the resistance of the electrical resistor element 100 by applying electrical pulses to the ferroelectric layer 103 such that the ferroelectric domain wall 108 is moved.

The ferroelectric layer 103 is embodied as ferroelectric thin film. According to preferred embodiments, the thickness d of the ferroelectric layer is less than 10 nm. According to further preferred embodiments, the thickness d is less than 5 nm. According to further preferred embodiments, the thickness d is less than 2 nm.

According to the embodiments as illustrated in FIGS. 1a to 1c, the tunnel resistance of the electrical resistor element 100 is determined as resistance of the resistor element. The ferroelectric layer 103 has different specific tunnel resistances in dependence on the polarization direction and hence the first area 104 has a different tunnel resistance than the second area 106.

According to embodiments, the total resistance of the ferroelectric layer 103 may be assessed as follows.

It may be assumed/estimated that the first area 104 has a first tunnel resistance $R_{tunnel1} = \rho_{tunnelup} * L_{up1} * A$ and the second area has a second tunnel resistance $R_{tunnel2} = \rho_{tunneldown} * L_{down1} * A$.

$\rho_{tunnelup}$ is the specific resistance of the first area 104 having the first polarization direction 105 and $\rho_{tunneldown}$ is the specific resistance of the second area 106 having the second polarization direction 107. $L_{up1}$ is the length of the first area 104 in the x-direction and $L_{up2}$ the length of the second area 106 in the x-direction. A is the cross section of the ferroelectric layer 103 in the y-z-plane.

The total tunnel resistance $R_{tunneltot}$ of the ferroelectric layer 103 between the first contact electrode 101 and the second contact electrode 102 may then be calculated as a parallel arrangement of the first tunnel resistance $R_{tunnel1}$ and the second tunnel resistance $R_{tunnel2}$:

$$R_{tunneltot} = \frac{1}{\left(\frac{1}{R_{tunnel_1}} + \frac{1}{R_{tunnel_2}}\right)}$$

For reading out the respective tunnel resistance, a voltage $V_{probe}$ is applied to the first contact electrode 101 and the corresponding tunnel current $I_{tunnel}$ is measured.

In order to tune the resistance of the electrical resistor element 100, electrical pulses are applied to the first contact electrode 101. The direction of the resistance change may be determined by the polarity of the voltage pulse. This is illustrated in FIGS. 1b and 1c. In the following it is assumed that $\beta_{tunnelup} > \rho_{tunneldown}$. Furthermore, the tunnel resistances $R_{tunneltot}$ of the electrical resistor element 100 of FIGS. 1a, 1b and 1c are denoted as $R_1$, $R_2$ and $R_3$.

Some background information about ferroelectric tunnel resistors may be found in the document by Chanthbouala et al., "A ferroelectric memristor", Nat. Materials 2012.

FIG. 1b shows the electrical resistor element 100 after a positive voltage pulse 131 of a positive polarity has been applied. The positive voltage pulse 131 has shifted the domain wall 108 to the right. Accordingly, the first area 104 and its corresponding length $L_{up2}$ have been increased as well as the resistance $R_2$ of the electrical resistor element 100.

FIG. 1c shows the electrical resistor element 100 after a negative voltage pulse 132 of a negative polarity has been applied. The negative voltage pulse 132 has shifted the domain wall 108 back to the left. Accordingly, the first area 104 and its corresponding length $L_{up2}$ have been decreased as well as the resistance $R_3$ of the electrical resistor element 100.

In summary, $R_1 \langle R_3 \langle R_2$.

As illustrated above, the resistor element is configured to tune the resistance by the volume ratio of the first area having the first tunnel resistance and the second area having the second tunnel resistance. By shifting the domain wall 108, this volume ratio can be changed. Hence the tunable resistance of the electrical resistor element 100 is defined by the position of the domain wall 108.

According to embodiments, the control circuit 120 can control the position of the domain wall 108 by the pulse length PL of the electrical pulses. The longer the pulse length PL, the greater the resistance change in the corresponding direction. Alternatively, a series of (short) pulses may be used to change the resistance.

Figure 2A:
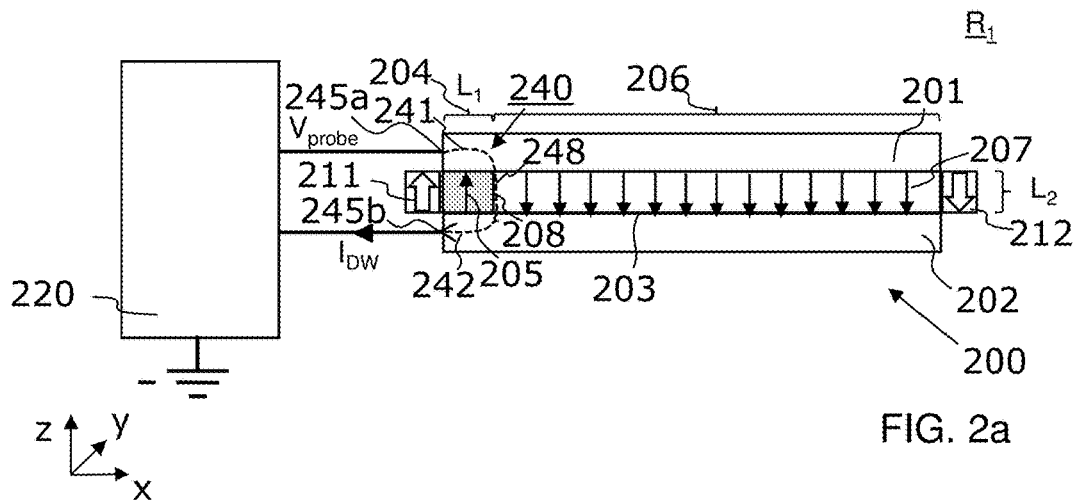
FIGS. 2a, 2b and 2c illustrate an electrical resistor element according to another embodiment of the invention in different resistance states.
Figure 2B:
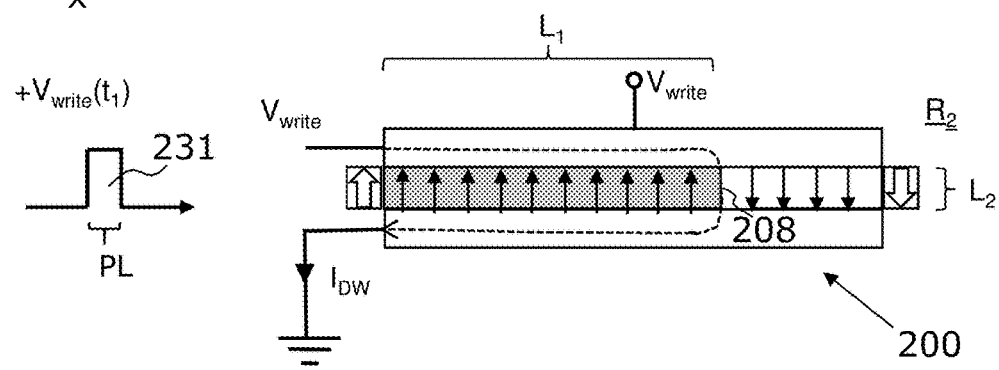
Figure 2C:
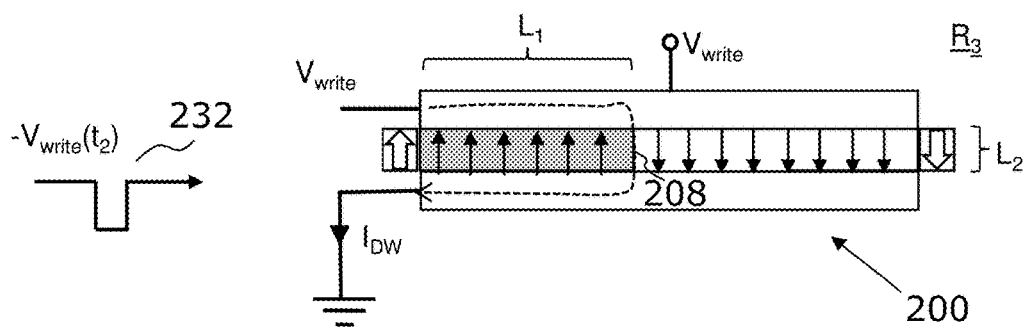

FIGS. 2a, 2b and 2c illustrate an electrical resistor element according to another embodiment of the invention in different resistance states. According to this embodiment, the domain wall is embodied as conductive domain wall. Some background information about ferroelectric layers comprising domain walls may be found in the document by Crassous et al., "Polarization charge as a reconfigurable quasi-dopant in ferroelectric thin films", Nature Nanotechnology 10, 614-618, 2015.

Referring to FIG. 2a, an electrical resistor element 200 is shown having a first contact electrode 201, a second contact electrode 202 and a ferroelectric layer 203 arranged between the first contact electrode 201 and the second contact electrode 202.

The ferroelectric layer 203 comprises a first area 204 having a first polarization direction 205 and a second area 206 having a second polarization direction 207. The first polarization direction 205 is opposite to the second polarization direction 207.

The first area 204 and the second area 206 are separated by a domain wall 208. The domain wall 208 is embodied as conductive domain wall.

The electrical resistor element 200 further comprises a first pinning element 211 configured to stabilize the first polarization direction 205 of the ferroelectric layer 203 and a second pinning element 212 configured to stabilize the second polarization direction 207 of the ferroelectric layer 203.

Furthermore, a control circuit 220 is configured to tune the resistance of the electrical resistor element 200 by applying electrical pulses to the ferroelectric layer 203 such that the conductive ferroelectric domain wall 208 is moved.

For reading out the respective tunnel resistance, a voltage $V_{probe}$ is applied to the first contact electrode 201 and the corresponding current $I_{DW}$ through the conductive domain wall 208 is measured. The tunable resistance of the resistive memory element 200 is determined by the total resistance of the serial arrangement of the first contact electrode 201, the conductive domain wall 208 and the second contact electrode 202.

According to this embodiment, the first contact electrode 201 and the second contact electrode 202 are embodied as resistive electrodes, i.e. they have a predefined resistance, preferably a predefined minimum resistance. The predefined resistance is chosen such that it allows to tune the resistance of the electrical resistor element 200 by the length of the current path within the first contact electrode 201 and the second contact electrode 202. The current path 240 is illustrated by a dotted line. The current path 240 extends from a contact point 245a, at which the first contact electrode 201 is contacted by the control circuit or (unit 220) and a contact point 245b at which the second contact electrode 202 is contacted by the control circuit 220. The current path 240 comprises a sub-path 241 within the first contact electrode 201, a sub-path 248 through the conductive domain wall 208 and a sub-path 242 within the second contact electrode 202.

The total tunable resistance $R_{tune}$ of the electrical resistor element 200 is given by $$R_{tune} = 2\rho_{contact} L_1 A_1 + \rho_{domain\ wall} L_2 A_2,$$

wherein $\rho_{contact}$ is the specific resistance of the first contact electrode 201 and the second contact electrode 202, $L_1$ is the length of the sub-path 241 and the length of the sub-path 242, $\rho_{domain\ wall}$ is the specific resistance of the conductive domain wall 208, $L_2$ is the length of the sub-path 248, $A_1$ the cross section of the first contact electrode 201 and the second contact electrode 202 in the y-z-plane and $A_2$ the cross section of the conductive domain wall 208 in the x-y-plane.

In order to tune the resistance of the electrical resistor element 200, electrical pulses are applied to the first contact electrode 201. The direction of the resistance change may be determined by the polarity of the voltage pulse. This is illustrated in FIGS. 2b and 2c. In the following the total tunable resistances of the electrical resistor element 200 of FIGS. 1a, 1b and 1c are denoted as $R_1$, $R_2$ and $R_3$.

FIG. 2b shows the electrical resistor element 200 after a positive voltage pulse 231 of a positive polarity has been applied. The positive voltage pulse 231 has shifted the domain wall 208 to the right. Accordingly, the first area 204 and the its corresponding length $L_1$ have been increased as well as the resistance $R_2$ of the electrical resistor element 100.

FIG. 2c shows the electrical resistor element 200 after a negative voltage pulse 232 of a negative polarity has been applied. The negative voltage pulse 232 has shifted the domain wall 208 back to the left. Accordingly, the first area 204 and its corresponding length $L_1$ have been decreased as well as the resistance $R_3$ of the electrical resistor element 200.

In summary, $R_1 \langle R_3 \langle R_2$.

Hence, according to the embodiments as illustrated in FIGS. 2a, 2b and 2c, the resistance of the electrical resistor element 200 can be tuned by the length $L_1$. Accordingly, the tunable resistance of the electrical resistor element 200 is defined by the position of the domain wall 208.

According to embodiments, the control circuit 220 can control the position of the conductive domain wall by the pulse length PL of the electrical pulses. The longer the pulse length PL, the greater the resistance change in the corresponding direction. Alternatively, a series of (short) pulses may be used to change the resistance.

Figure 3:
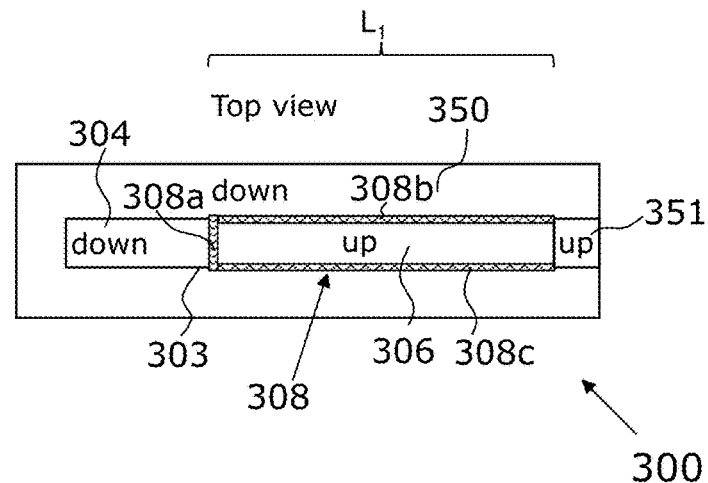
FIG. 3 shows a top view of an electrical resistor element according to an embodiment of the invention.

FIG. 3 shows a top view of an electrical resistor element 300 according to an embodiment of the invention. The electrical resistor element 300 comprises a ferroelectric layer 303 that is arranged between a first contact electrode and a second contact electrode which are not shown in FIG. 3 for ease of illustration. The ferroelectric layer 303 is surrounded by a ferroelectric layer 350, which is polarized in a first polarization direction (in this example down) and a ferroelectric layer 351, which is polarized in a second polarization direction (in this example up). The polarization of the ferroelectric layers 350, 351 is fixed by not shown pinning elements and will not be changed during the tuning of the resistance. The inner ferroelectric layer 303 comprises a first area 304 having a first polarization direction (down) and a second area 306 having a second, opposite polarization direction (up). The ferroelectric layer 303 comprises a ferroelectric domain wall 308, which has side portions 308b and 308c and a front portion 308a. The resistance of the electrical resistor element 300 between the not shown first and second contact electrodes (top/bottom contact electrodes) is dependent on the total length of the domain wall 308. Accordingly, the resistance can be tuned by the length $L_1$ of the side portions 308b and 308c of the ferroelectric domain wall 308.

Figure 4A:
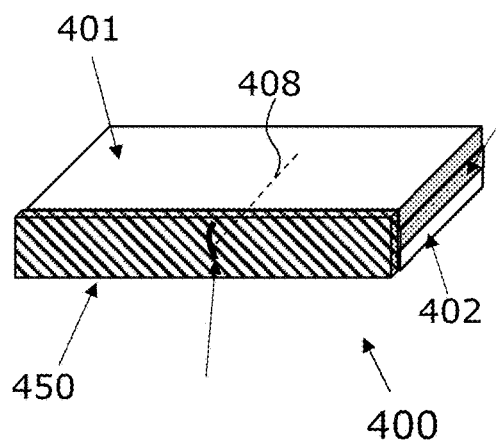
FIGS. 4a and 4b show 3-dimensional views of an electrical resistor element according to another embodiment of the invention.
Figure 4B:
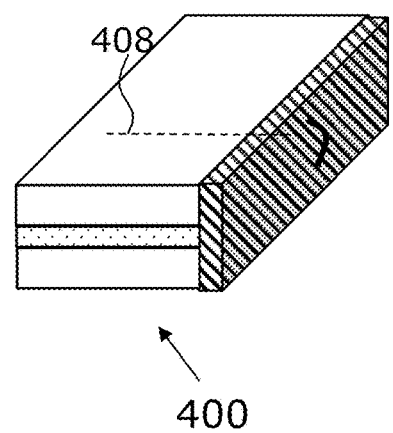

FIGS. 4a and 4b shows two 3-dimensional views of an electrical resistor element 400 according to another embodiment of the invention.

The electrical resistor element 400 comprises a first contact electrode 401, a second contact electrode 402 and a ferroelectric layer 403 arranged between the first contact electrode 401 and the second contact electrode 402. The electrical resistor element 400 comprises a piezoresistive layer 450 adjacent to the ferroelectric layer 403, the first contact electrode 401 and the second contact electrode 402. The ferroelectric layer 403 comprises areas of different polarization separated by a domain wall 408, which is schematically indicated by a dotted line.

The ferroelectric domain wall 408 applies strain on the piezoresistive layer 450. This changes the electrical resistance of the piezoelectric layer 450 and hence of the electrical resistor element 400. In other words, the piezoelectric layer 450 provides a bypath or shortcut between the first contact electrode 401 and the second contact electrode 402 at the position of the domain wall 408.

FIGS. 5 to 8 show electrical resistor elements 500, 600, 700 and 800 with different configurations of pinning elements.

The basic configurations of the resistor elements 500, 600, 700 and 800 is the same. More particularly, the resistor elements 500, 500, 700 and 800 comprise a first contact electrode 501, a second contact electrode 502 and a ferroelectric layer 503 arranged between the first contact electrode 501 and the second contact electrode 502.

The ferroelectric layer 503 comprises a first area 504 having a first polarization direction 505 and a second area 506 having a second polarization direction 507. The first area 504 and the second area 506 are separated by a domain wall 508.

Figure 5:
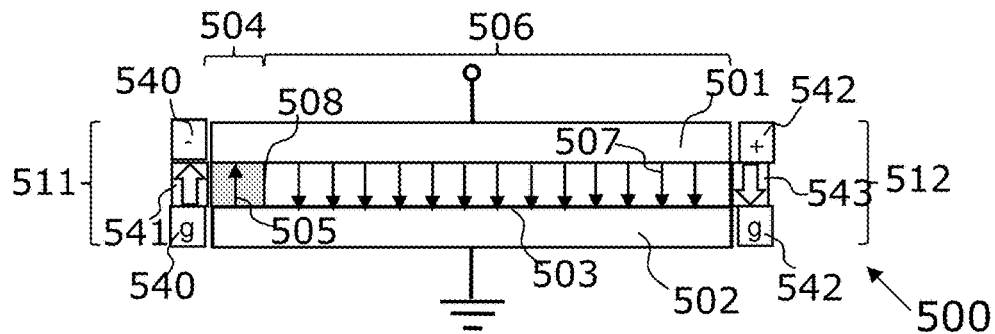
FIG. 5 shows an electrical resistor element with a first configuration of pinning elements.

Referring now to FIG. 5, the resistor element 500 comprises a first pinning element 511. The first pinning element 511 comprises a first set of static pinning electrodes 540 and a ferroelectric pinning layer 541. The second pinning element 512 comprises a second set of static pinning electrodes 542 and a ferroelectric pinning layer 543. The first set of static pinning electrodes 540 polarizes the first ferroelectric pinning layer 541 in the first polarization direction and the second set of static pinning electrodes 542 polarizes the second ferroelectric pinning layer 543 in the second polarization direction. The first pinning element 511 and the second pinning element 512 apply a higher coercive field on the ferroelectric layer 503 than the electrical pulses applied by the control unit.

Figure 6:
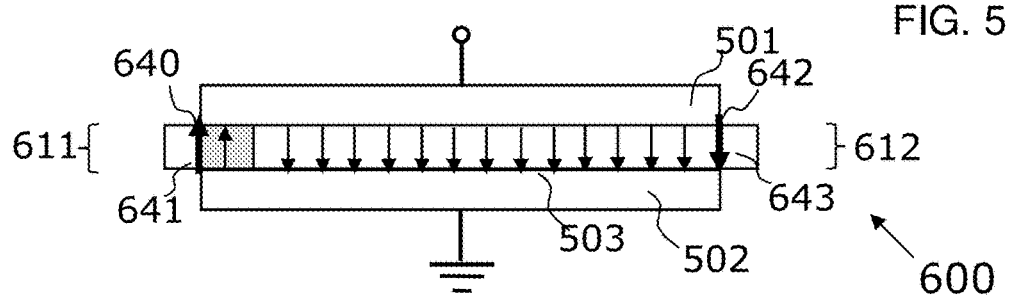
FIG. 6 shows an electrical resistor element with a second configuration of pinning elements.

Referring now to FIG. 6, the resistor element 600 comprises a first pinning element 611. The first pinning element 611 comprises a first polarized interface 640 which poles a first ferroelectric pinning layer 641 in the first polarization direction. The first polarized interface 640 is established at the boundary surface between the ferroelectric pinning layer 641 and the ferroelectric layer 503. In addition, the resistor element 600 comprises a second pinning element 612. The second pinning element 612 comprises a second polarized interface 642 which poles a second ferroelectric pinning layer 643 in the second polarization direction. The second polarized interface 642 is established at the boundary surface between the ferroelectric pinning layer 643 and the ferroelectric layer 503. The polarized interfaces 640, 642 may be embodied e.g. as dipoles established at the boundary surfaces between the ferroelectric pinning layers 641, 643 and the ferroelectric layer 503.

Figure 7:
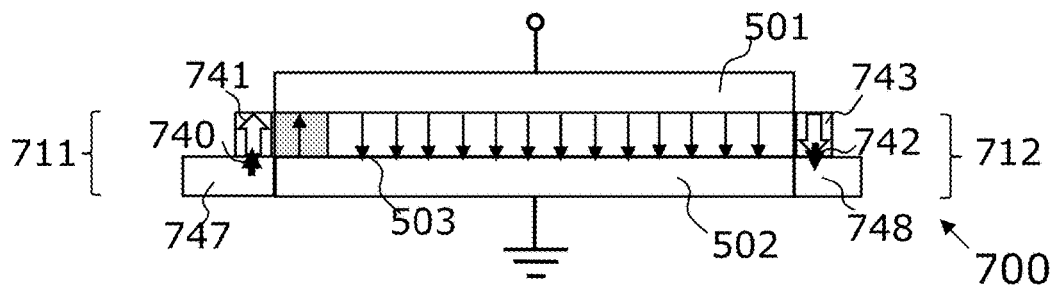
FIG. 7 shows an electrical resistor element with a third configuration of pinning elements.

Referring now to FIG. 7, the resistor element 700 comprises a first pinning element 711. The first pinning element 711 comprises a first polarized interface 740, which poles a first ferroelectric pinning layer 741 in the first polarization direction. In addition, the resistor element 700 comprises a second pinning element 712. The second pinning element 712 comprises a second polarized interface 742, which poles a second ferroelectric pinning layer 743 in the second polarization direction. The polarized interface 740 is established at a boundary surface between the ferroelectric pinning layer 741 and a first bottom layer 747. The polarized interface 742 is established at a boundary surface between the ferroelectric pinning layer 743 and a second bottom layer 748. According to some embodiments, the first bottom layer 747 and the second bottom layer 748 may be embodied of different materials to provide polarized interfaces of different polarities. According to other embodiments, the first ferroelectric pinning layer 741 and the second ferroelectric pinning layer 743 may comprise different materials to provide polarized interfaces of different polarities.

Figure 8:
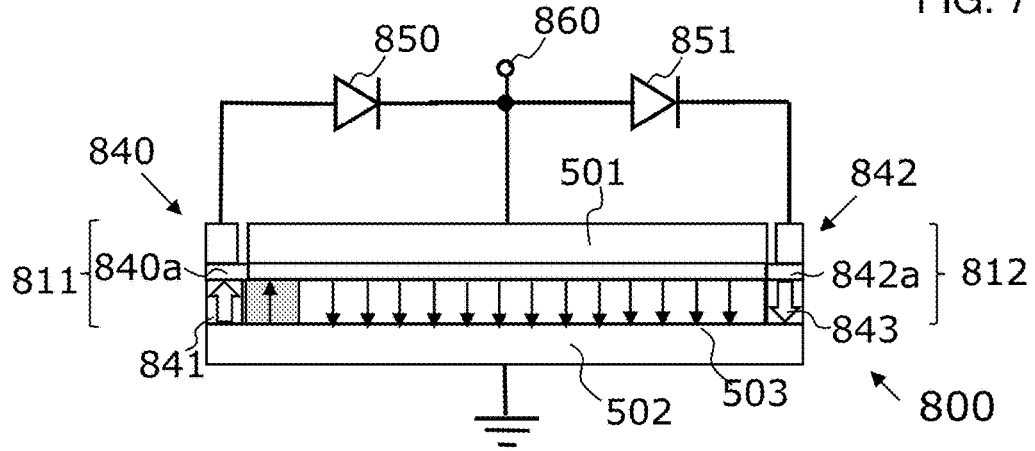
FIG. 8 shows an electrical resistor element with a fourth configuration of pinning elements.

Referring now to FIG. 8, the resistor element 800 comprises a first pinning element 811 and a second pinning element 812. The first pinning element 811 comprises a first ferroelectric pinning layer 841 and a first coupling electrode 840. The second pinning element 812 comprises a second ferroelectric pinning layer 843 and a second coupling electrode 842. The first coupling electrode 840 comprises a layer 840a with a low resistance and the second coupling electrode 842 comprises a layer 842a with low resistance.

The first coupling electrode 840 is coupled via a diode 850 to an input port 860 and the second coupling electrode 842 is coupled via a diode 851 to the input port 860. The input port 860 is configured to receive the electrical pulses to tune the resistance of the resistor element 800. Electrical pulses of a negative polarity are applied to the first pinning element 811 via the diode 850 and in parallel to the first contact electrode 501. Electrical pulses of a positive polarity are applied to the second pinning element 812 via the diode 851 and in parallel to the first contact electrode 501. The first contact electrode 501 comprises a layer with a high resistance. High resistance in this context shall mean a higher resistance than the low resistance of the layers 840a and 842a. As a result, the coupling resistance of the first coupling electrode 840 and of the second coupling electrode 842 is lower than the coupling resistance of the first contact electrode 501. The lower coupling resistance of the first coupling electrode 840 and the second coupling electrode 842 results in an increased electrical field of the electrical pulses in the area of the first coupling electrode 840 or the second coupling electrode 842. This stabilizes the corresponding polarization.

Figure 9:
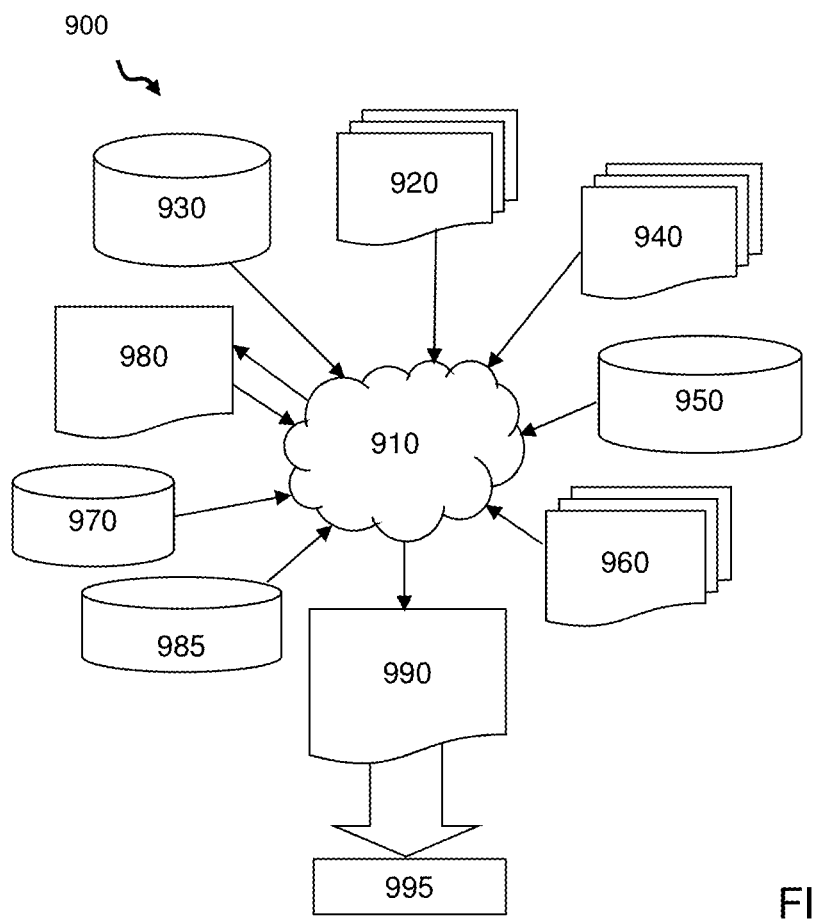
FIG. 9 shows a block diagram of an exemplary design flow used for example, in semiconductor IC logic design, simulation, test, layout, and manufacture.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown e.g. in FIGS. 1 to 8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 to 8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 to 8. In one embodiment, design structure 990 may comprise a compiled, executable HDL simulation model that functionally simulates the devices shown in FIGS. 1-6, 8 and 10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 to 8. Design structure 990 may then proceed to a stage 995 where, for example, design structure 990: proceeds to tape-out, is released to manufacturing, is released to a mask house, is sent to another design house, is sent back to the customer, etc.

Figure 10:
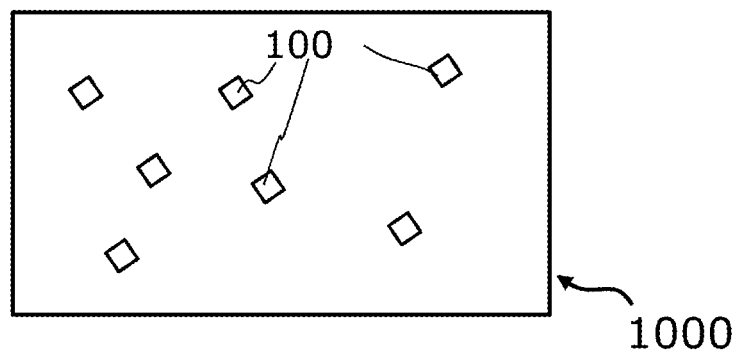
FIG. 10 shows a neuromorphic computing system according to an embodiment of the invention.

FIG. 10 shows a neuromorphic computing system 1000 according to an embodiment of the invention. The neuromorphic computing system 1000 comprises a plurality of electrical resistor elements, e.g. the electrical resistor elements 100 as described with reference to FIG. 1 as synapses. The weight of the synapses can be symmetrically changed by applying electrical pulses as described above.

Figure 11:
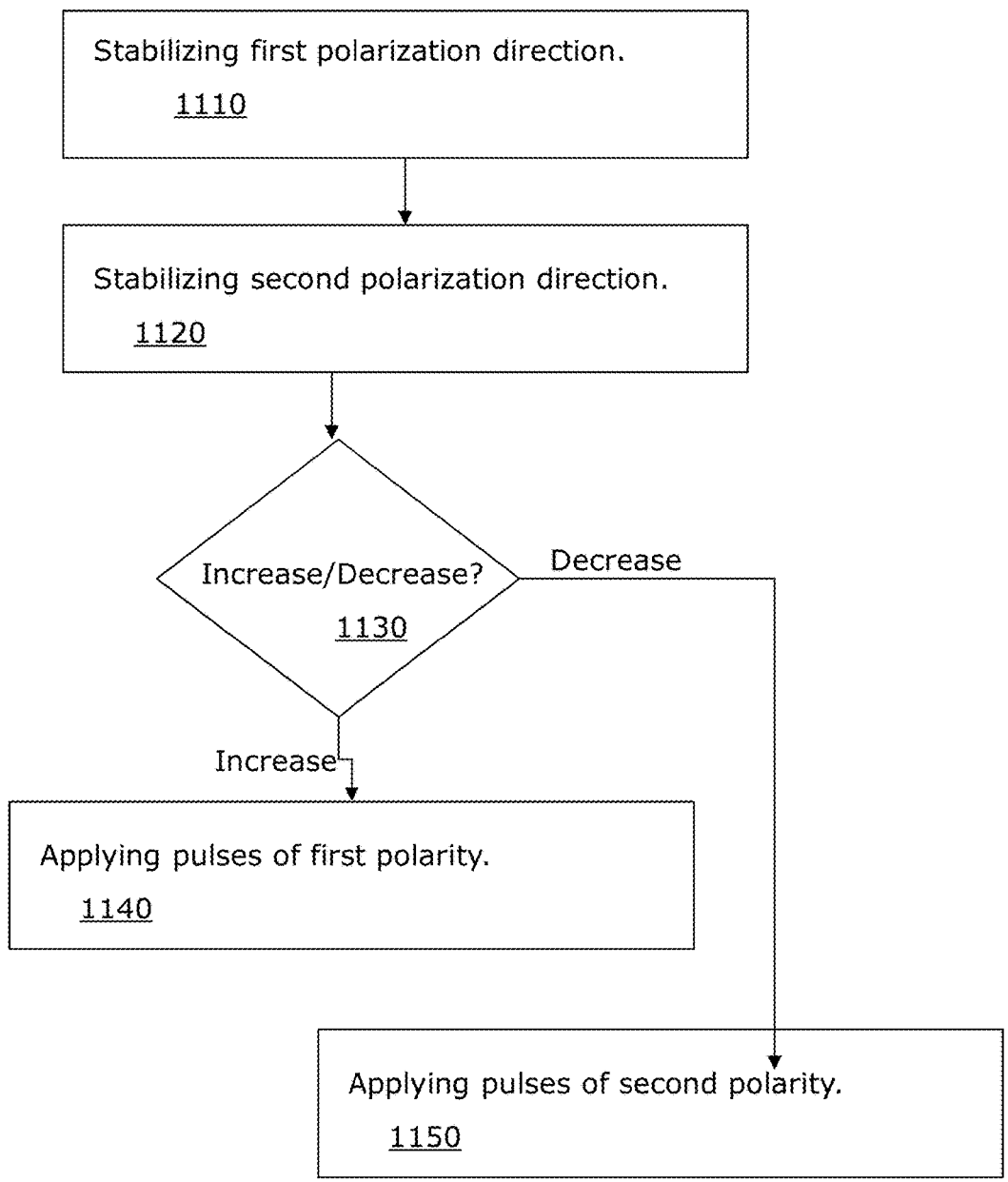
FIG. 11 is a flow chart depicting a method for tuning the resistance of an electrical resistor element.

FIG. 11 shows method steps of a method for tuning the resistance of an electrical resistor element. In the following the method is described with reference to the electrical resistor element 100 of FIG. 1.

At a step 1110, the first pinning element 111 stabilizes the first polarization direction of the ferroelectric layer 103.

At a step 1120, the second pinning element 112 stabilizes the second polarization direction of the ferroelectric layer 103.

At a step 1130, it is checked whether the resistance shall be increased or decreased.

If the resistance shall be increased, the control circuit 120 applies at a step 1140 electrical pulses of the first polarity. As a result, the ferroelectric domain wall 108 moves in a first direction.

If the resistance shall be decreased, the control circuit 120 applies at a step 1150 electrical pulses of a second opposite polarity. As a result, the ferroelectric domain wall 108 moves in a second opposite direction.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrical resistor element with tunable resistance, comprising:
    a first contact electrode;
    a second contact electrode;
    a ferroelectric layer arranged between the first contact electrode and the second contact electrode, the ferroelectric layer comprising:
        a first area having a first polarization direction;
        a second area having a second polarization direction, the first polarization direction being different to the second polarization direction; and
        a domain wall between the first area and the second area;
            a first pinning element configured to stabilize the first polarization direction of the ferroelectric layer; and
            a control circuit configured to tune the resistance of the electrical resistor element by applying electrical pulses to the ferroelectric layer such that the ferroelectric domain wall is moved; and
    a second pinning element configured to stabilize the second polarization direction of the ferroelectric layer, wherein the first pinning element comprises a first set of static pinning electrodes configured to polarize a first ferroelectric pinning layer in the first polarization direction, and the second pinning element comprises a second set of static pinning electrodes configured to polarize a second ferroelectric pinning layer in the second polarization direction.

2. An electrical resistor element according to claim 1, wherein the control circuit is configured to:
    increase the resistance of the resistor element by applying electrical pulses of a first polarity; and
    decrease the resistance of the resistor element by applying electrical pulses of a second polarity, the second polarity being opposite to the first polarity.

3. An electrical resistor element according to claim 2, wherein:
    the first pinning element comprises a first coupling electrode;
    the second pinning element comprises a second coupling electrode;
    the electrical resistor element is configured to apply, the electrical pulses of the first polarity in parallel to the first pinning element and to the first contact electrode; and
    the electrical pulses of the second polarity in parallel to the second pinning element and to the first contact electrode; and wherein a coupling resistance of the first coupling electrode and of the second coupling electrode is lower than a coupling resistance of the first contact electrode.

4. An electrical resistor element according to claim 1, wherein the tunable resistance of the electrical resistor element is defined by the position of the domain wall.

5. An electrical resistor element according to claim 4, wherein the control circuit is configured to control the position of the domain wall by the pulse length of the electrical pulses.

6. An electrical resistor element according to claim 1, wherein the ferroelectric layer is embodied as ferroelectric thin film having a thickness of less than 10 nm.

7. An electrical resistor element according to claim 6, wherein:
    the first area has a first tunnel resistance and the second area has a second tunnel resistance; and
    the resistor element is configured to tune the resistance by the volume ratio of the first area having the first tunnel resistance and the second area having the second tunnel resistance.

8. An electrical resistor element according to claim 1, wherein the domain wall is a conductive domain wall.

9. An electrical resistor element according to claim 8, wherein the tunable resistance is determined by a total resistance of a serial arrangement of the first contact electrode, the conductive domain wall and the second contact electrode.

10. An electrical resistor element according to claim 8, wherein the conductive domain wall has side portions and a front portion and wherein the resistor element is configured to tune the resistance by the length of the side portions of the conductive domain wall.

11. An electrical resistor element according to claim 8, wherein the first contact electrode and the second contact electrode are embodied as resistive electrodes and wherein the resistor element is configured to tune the resistance by a length of a current path within the first and the second contact electrodes.

12. An electrical resistor element according to claim 1, comprising a piezoresistive layer adjacent to the ferroelectric layer, wherein the ferroelectric domain wall is configured to apply strain on the piezoresistive layer, thereby changing the electrical resistance of the piezoresistive layer and of the electrical resistor element.

13. An electrical resistor element according to claim 1, wherein:
the first pinning element comprises a first polarized interface configured to pole a first ferroelectric pinning layer in the first polarization direction and the second pinning element comprises a second polarized interface configured to pole a second ferroelectric pinning layer in the second polarization direction.

14. An electrical resistor element according to claim 1, wherein the ferroelectric layer comprises a material selected from the group consisting of:
BaTiO3, BiFeO3, PbTiO3, LiNbO3, Pb[$Zr_xTi_{1-x}$]$O_3$ and ferroelectric polymers.

15. A neuromorphic computing system, comprising:
a plurality of electrical resistor elements as synapses each of the plurality of electrical resistor elements having tunable resistance, and each of the plurality of electrical resister elements including:
a first contact electrode;
a second contact electrode;
a ferroelectric layer arranged between the first contact electrode and the second contact electrode, the ferroelectric layer comprising:
a first area having a first polarization direction;
a second area having a second polarization direction, the first polarization direction being different to the second polarization direction; and
a domain wall between the first area and the second area;
a first pinning element configured to stabilize the first polarization direction of the ferroelectric layer; and
a control circuit configured to tune the resistance of the electrical resistor element by applying electrical pulses to the ferroelectric layer such that the ferroelectric domain wall is moved; and
a second pinning element configured to stabilize the second polarization direction of the ferroelectric layer, wherein the first pinning element comprises a first set of static pinning electrodes configured to polarize a first ferroelectric pinning layer in the first polarization direction, and the second pinning element comprises a second set of static pinning electrodes configured to polarize a second ferroelectric pinning layer in the second polarization direction.

16. A method for tuning the resistance of an electrical resistor element, comprising:
stabilizing, by a first pinning element, a first polarization direction of a ferroelectric layer of an electrical resistor element; and
tuning, by a control circuit, a resistance of the electrical resistor element by applying electrical pulses to the ferroelectric layer, thereby moving a ferroelectric domain wall;
the electrical resistor element, including:
a first contact electrode;
a second contact electrode;
the ferroelectric layer arranged between the first contact electrode and the second contact electrode, the ferroelectric layer including:
a first area having the first polarization direction;
a second area having a second polarization direction, the first polarization direction being different to the second polarization direction; and
the domain wall being between the first area and the second area; and
a second pinning element configured to stabilize the second polarization direction of the ferroelectric layer, wherein the first pinning element comprises a first set of static pinning electrodes configured to polarize a first ferroelectric pinning layer in the first polarization direction, and the second pinning element comprises a second set of static pinning electrodes configured to polarize a second ferroelectric pinning layer in the second polarization direction.

17. A method according to claim 16, the method comprising:
increasing the resistance of the resistor element by applying electrical pulses of a first polarity; and
decreasing the resistance of the resistor element by applying electrical pulses of a second polarity, the second polarity being opposite to the first polarity.

18. An electrical resistor element with tunable resistance, comprising:
a first contact electrode;
a second contact electrode;
a ferroelectric layer arranged between the first contact electrode and the second contact electrode, the ferroelectric layer comprising:
a first area having a first polarization direction;
a second area having a second polarization direction, the first polarization direction being different to the second polarization direction; and
a domain wall between the first area and the second area;
a first pinning element configured to stabilize the first polarization direction of the ferroelectric layer; and
a control circuit configured to tune the resistance of the electrical resistor element by applying electrical pulses to the ferroelectric layer such that the ferroelectric domain wall is moved, wherein the control circuit is configured to increase the resistance of the resistor element by applying electrical pulses of a first polarity, and decrease the resistance of the resistor element by applying electrical pulses of a second polarity, the second polarity being opposite to the first polarity;
the first pinning element comprises a first coupling electrode;
a second pinning element comprises a second coupling electrode;
the electrical resistor element is configured to apply, the electrical pulses of the first polarity in parallel to the first pinning element and to the first contact electrode;
the electrical pulses of the second polarity in parallel to the second pinning element and to the first contact electrode; and wherein a coupling resistance of the first coupling electrode and of the second coupling electrode is lower than a coupling resistance of the first contact electrode.

19. An electrical resistor element according to claim 18, further comprising a second pinning element configured to stabilize the second polarization direction of the ferroelectric layer.

20. An electrical resistor element according to claim 19, wherein:
the first pinning element comprises a first set of static pinning electrodes configured to polarize a first ferroelectric pinning layer in the first polarization direction; and the second pinning element comprises a second set of static pinning electrodes configured to polarize a second ferroelectric pinning layer in the second polarization direction.

21. An electrical resistor element according to claim 19, wherein: the first pinning element comprises a first polarized interface configured to pole a first ferroelectric pinning layer in the first polarization direction and the second pinning element comprises a second polarized interface configured to pole a second ferroelectric pinning layer in the second polarization direction.

22. An electrical resistor element according to claim 18, wherein the tunable resistance of the electrical resistor element is defined by the position of the domain wall.

23. An electrical resistor element according to claim 22, wherein the control circuit is configured to control the position of the domain wall by the pulse length of the electrical pulses.

24. An electrical resistor element according to claim 18, wherein the ferroelectric layer is embodied as ferroelectric thin film having a thickness of less than 10 nm.

25. An electrical resistor element according to claim 24, wherein:
the first area has a first tunnel resistance and the second area has a second tunnel resistance; and
the resistor element is configured to tune the resistance by the volume ratio of the first area having the first tunnel resistance and the second area having the second tunnel resistance.

26. An electrical resistor element according to claim 18, wherein the domain wall is a conductive domain wall.

27. An electrical resistor element according to claim 26, wherein the tunable resistance is determined by a total resistance of a serial arrangement of the first contact electrode, the conductive domain wall and the second contact electrode.

28. An electrical resistor element according to claim 26, wherein the conductive domain wall has side portions and a front portion and wherein the resistor element is configured to tune the resistance by the length of the side portions of the conductive domain wall.

29. An electrical resistor element according to claim 26, wherein the first contact electrode and the second contact electrode are embodied as resistive electrodes and wherein the resistor element is configured to tune the resistance by a length of a current path within the first and the second contact electrodes.

30. An electrical resistor element according to claim 18, comprising a piezoresistive layer adjacent to the ferroelectric layer, wherein the ferroelectric domain wall is configured to apply strain on the piezoresistive layer, thereby changing the electrical resistance of the piezoresistive layer and of the electrical resistor element.

31. An electrical resistor element according to claim 18, wherein the ferroelectric layer comprises a material selected from the group consisting of:
BaTiO3, BiFeO3, PbTiO3, LiNbO3, Pb[$Zr_xTi_{1-x}$]O3 and ferroelectric polymers.

32. A neuromorphic computing system, comprising:
a plurality of electrical resistor elements as synapses each of the plurality of electrical resistor elements having tunable resistance, and each of the plurality of electrical resister elements including:
a first contact electrode;
a second contact electrode;
a ferroelectric layer arranged between the first contact electrode and the second contact electrode, the ferroelectric layer comprising:
a first area having a first polarization direction;
a second area having a second polarization direction, the first polarization direction being different to the second polarization direction; and
a domain wall between the first area and the second area;
a first pinning element configured to stabilize the first polarization direction of the ferroelectric layer; and
a control circuit configured to tune the resistance of the electrical resistor element by applying electrical pulses to the ferroelectric layer such that the ferroelectric domain wall is moved, wherein the control circuit is configured to increase the resistance of the resistor element by applying electrical pulses of a first polarity, and decrease the resistance of the resistor element by applying electrical pulses of a second polarity, the second polarity being opposite to the first polarity;
the first pinning element comprises a first coupling electrode;
a second pinning element comprises a second coupling electrode;
the electrical resistor element is configured to apply, the electrical pulses of the first polarity in parallel to the first pinning element and to the first contact electrode;
the electrical pulses of the second polarity in parallel to the second pinning element and to the first contact electrode; and wherein a coupling resistance of the first coupling electrode and of the second coupling electrode is lower than a coupling resistance of the first contact electrode.

33. A method for tuning the resistance of an electrical resistor element, comprising:
stabilizing, by a first pinning element, a first polarization direction of a ferroelectric layer of an electrical resistor element; and
tuning, by a control circuit, a resistance of the electrical resistor element by applying electrical pulses to the ferroelectric layer, thereby moving a ferroelectric domain wall;
the electrical resistor element, including:
a first contact electrode;
a second contact electrode;
the ferroelectric layer arranged between the first contact electrode and the second contact electrode, the ferroelectric layer including:
a first area having the first polarization direction;
a second area having a second polarization direction, the first polarization direction being different to the second polarization direction; and
the domain wall being between the first area and the second area;
wherein the control circuit is configured to increase the resistance of the resistor element by applying electrical pulses of a first polarity, and decrease the resistance of the resistor element by applying electrical pulses of a second polarity, the second polarity being opposite to the first polarity;
the first pinning element comprises a first coupling electrode;
a second pinning element comprises a second coupling electrode;

the electrical resistor element is configured to apply, the electrical pulses of the first polarity in parallel to the first pinning element and to the first contact electrode;

the electrical pulses of the second polarity in parallel to the second pinning element and to the first contact electrode; and wherein a coupling resistance of the first coupling electrode and of the second coupling electrode is lower than a coupling resistance of the first contact electrode.

34. A method according to claim 33, the method comprising:

increasing the resistance of the resistor element by applying electrical pulses of a first polarity; and decreasing the resistance of the resistor element by applying electrical pulses of a second polarity, the second polarity being opposite to the first polarity.

* * * * *